US008095832B2

(12) United States Patent
Lee et al.

(10) Patent No.: US 8,095,832 B2
(45) Date of Patent: Jan. 10, 2012

(54) METHOD FOR REPAIRING MEMORY AND SYSTEM THEREOF

(75) Inventors: Mincent Lee, Taipei (TW); Cheng Wen Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 185 days.

(21) Appl. No.: 12/168,488

(22) Filed: Jul. 7, 2008

(65) Prior Publication Data

US 2009/0119537 A1 May 7, 2009

(30) Foreign Application Priority Data

Nov. 6, 2007 (TW) ............................... 96141800 A

(51) Int. Cl.
G06F 11/00 (2006.01)
G11C 29/00 (2006.01)
G11C 7/00 (2006.01)
(52) U.S. Cl. ........ 714/710; 714/6.32; 714/711; 714/718
(58) Field of Classification Search .................. None
See application file for complete search history.

(56) References Cited

U.S. PATENT DOCUMENTS

| | | | | | |
|---|---|---|---|---|---|
| 4,389,715 A | * | 6/1983 | Eaton et al. | ..................... | 714/711 |
| 5,124,948 A | * | 6/1992 | Takizawa et al. | ............. | 365/200 |
| 5,659,678 A | * | 8/1997 | Aichelmann et al. | ........... | 714/25 |
| 6,085,334 A | * | 7/2000 | Giles et al. | .......................... | 714/7 |
| 6,363,020 B1 | * | 3/2002 | Shubat et al. | .................. | 365/200 |
| 6,795,942 B1 | * | 9/2004 | Schwarz | ........................ | 714/718 |
| 7,106,639 B2 | * | 9/2006 | Taussig et al. | ................. | 365/200 |
| 7,127,647 B1 | * | 10/2006 | Zorian et al. | ................... | 714/711 |
| 7,149,921 B1 | * | 12/2006 | Zorian et al. | ....................... | 714/6 |
| 7,149,924 B1 | * | 12/2006 | Zorian et al. | ..................... | 714/30 |
| 7,228,468 B2 | * | 6/2007 | Wu et al. | ........................ | 714/710 |
| 7,237,154 B1 | * | 6/2007 | Zorian | ........................... | 714/711 |
| 2003/0103394 A1 | * | 6/2003 | Koshikawa | .................... | 365/200 |
| 2005/0157572 A1 | * | 7/2005 | Yamada | ......................... | 365/200 |
| 2006/0064618 A1 | * | 3/2006 | Wu et al. | ........................ | 714/733 |
| 2006/0129899 A1 | * | 6/2006 | Cochran et al. | ............... | 714/718 |
| 2008/0192543 A1 | * | 8/2008 | Kim et al. | ................. | 365/185.09 |
| 2008/0288814 A1 | * | 11/2008 | Kitahara | ........................... | 714/5 |

OTHER PUBLICATIONS

Rei-Fu Huang, Jin-Fu Li, Jen-Chieh Yeh, and Cheng-Wen Wu, A Simulator for Evaluating Redundancy Analysis Algorithms of Repairable Embedded Memories, IEEE, 2002, 1087-4852/03, pp. 1-6.*

Chih-Tsun Huang, et al.; "Built-In Redundancy Analysis for Memory Yield Improvement," IEEE Trans. On Reliability, Dec. 2003; pp. 386-399; vol. 52, IEEE.

* cited by examiner

*Primary Examiner* — Jeffrey A Gaffin
*Assistant Examiner* — Guerrier Merant
(74) *Attorney, Agent, or Firm* — WPAT, P.C.; Anthony King

(57) ABSTRACT

A method for repairing a main memory comprises the steps of: utilizing a spare memory to repair a main memory, wherein the spare memory includes a plurality of spare memory units; allocating a spare memory unit; determining whether available permutations of the allocated spare memory unit cover a newly found defect in the main memory; removing permutations of the spare memory unit failing to cover newly found defects in the main memory; and allocating another spare memory unit to repair the newly found defects if available permutations of the allocated spare memory unit fails to cover the newly found defects.

17 Claims, 4 Drawing Sheets

US 8,095,832 B2

METHOD FOR REPAIRING MEMORY AND SYSTEM THEREOF

BACKGROUND OF THE INVENTION

1. Field of the Invention

The present invention relates to a method and system for repairing a main memory, and more particularly, to a method and system for repairing a main memory by utilizing a spare memory.

2. Description of the Related Art

With the progress of process technologies, the density and speed of integrated circuits are dramatically improved. However, the tolerance of the new technology to process variation, interference and electromigration becomes worse. Especially for memory circuits whose transistor density is higher than other logic circuits, it is found that the productive yield and reliability thereof decrease with the progress of process technologies. Therefore, it is necessary for the large-scaled memory to conduct a test and repair action to remain in a high yield state.

A well-known repair method is to utilize a spare memory to displace defects in a memory by a mapping table. Normally, one-dimensional or two-dimensional structures, like column or row spare memories are used to displace defects in a memory, based on a fault bitmap in a spare memory redundancy analysis table to conduct a repair action. In term of one-dimensional structure, such structure is too simple to repair two-dimensional defects in large-scaled memories. In term of two-dimensional structure, although such structure can repair two-dimensional defects, the defects which appear closely in row and column directions and form clusters cannot be effectively repaired.

Given that the repair method for a large-scaled memory is significantly important for a large-scaled memory, it is necessary to develop a simple and effective repair method and system.

SUMMARY OF THE INVENTION

The present invention proposes a method for repairing a main memory, comprising the steps of: utilizing a spare memory to repair a main memory, wherein the spare memory includes a plurality of spare memory units; allocating a spare memory unit; determining whether available permutations of the allocated spare memory unit cover a newly found defect in the main memory; removing permutations of the spare memory unit failing to cover newly found defects in the main memory; and allocating another spare memory unit to repair the newly found defects if available permutations of the allocated spare memory unit fails to cover the newly found defects.

The present invention proposes a method for repairing a main memory, comprising the steps of: utilizing a spare memory to repair a main memory, wherein the spare memory includes a plurality of spare memory units; comparing defective permutations of the main memory with available permutation of an allocated spare memory unit; excluding permutations of the allocated spare memory unit which fail to cover defective permutations of the main memory; and utilizing remaining permutations of the spare memory unit to repair the main memory.

The present invention proposes a system for repairing a main memory, which comprises a spare memory, a built-in self-test circuit, a built-in self-repair circuit and a spare memory redundancy analysis table. The spare memory is configured to provide a plurality of spare memory units. The built-in self-test circuit is connected to the memory and spare memory for testing defects and corresponding addresses of the memory. The built-in self-repair circuit is connected to the spare memory for allocating spare memory units in accordance with addresses of defects provided by the built-in self-test circuit. The spare memory redundancy analysis table is configured to record available permutations of the spare memory unit covering the defects.

BRIEF DESCRIPTION OF THE DRAWINGS

The invention will be described according to the appended drawings in which.

PREFERRED EMBODIMENT OF THE PRESENT INVENTION

Figure 1:
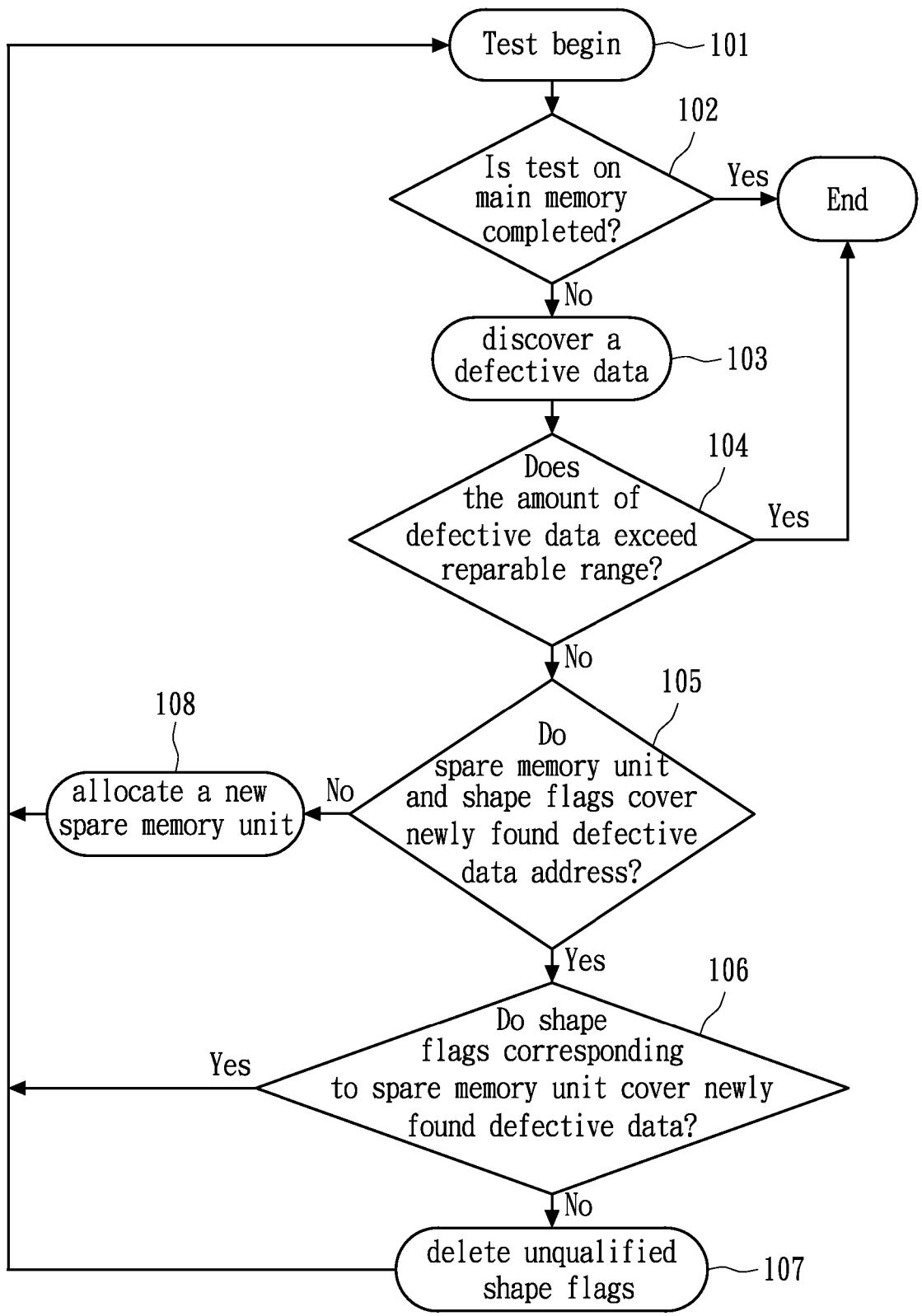
FIG. 1 shows a flow chart of repairing a memory according to one embodiment of the present invention.

FIG. 1 shows a flow chart of repairing a memory according to one embodiment of the present invention, in which a spare memory is used to repair a main memory. In Step 101, the main memory under test is conducting a test so as to obtain addresses of defects in the main memory. In Step 102, it is determined whether the test on the main memory is completed. If affirmative, spare memory units of the spare memory are used to repair the main memory, and the repair procedure ends. Otherwise, Step 103 is entered. In Step 103, a newly defective data is found in the repair procedure, and Step 104 is entered to examine whether the number of defective data exceeds reparable capacity of the spare memory. If affirmative, the repair procedure ends, and it means that the main memory cannot be repaired. Then, a step of displaying a message of failure to repair takes place if the defects of the main memory exceed the maximal reparable capacity of the spare memory, wherein "display" means show or output as its ordinary meaning. Otherwise, Step 105 is entered. In Step 105, it is determined whether the spare memory units and available shape flags in the spare memory units allocated to repair can cover the address of the newly found defective data. If affirmative, Step 106 is entered to examine which shape flags allocated to repair can cover the address of the newly found defective data. If the answer is affirmative, it returns to Step 107 to remove unqualified shape flags for the newly found defective data, and returns to Step 101 to keep testing. If the answer in Step 105 is negative, it means that all available shape flags of the allocated spare memory cannot cover the address of the newly found defective data. Meanwhile, it is necessary to allocate a new spare memory unit to cover the address of the newly found defective data and mark all shape flags which are capable of covering the address of the newly found defective data in the spare memory unit, as shown in Step 108. Next, it goes to Step 101 to proceed with the test. In Step 107, in the event that more than two spare memory units are suitable to remove the shape flags so as to cover the address of the newly found defective data, a favorable method is selected, e.g., the permutation of defective data which frequently appears in the main memory.

Figure 2A:
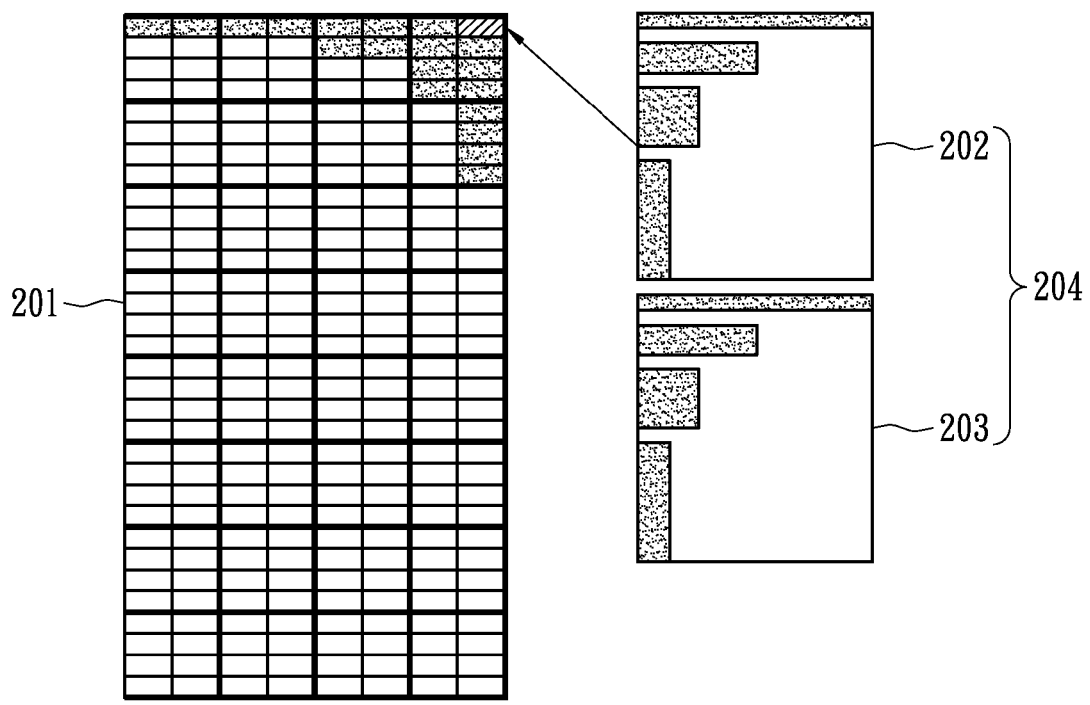
FIGS. 2A-2D show a hint diagram of repairing a memory according to one embodiment of the present invention.
Figure 2B:
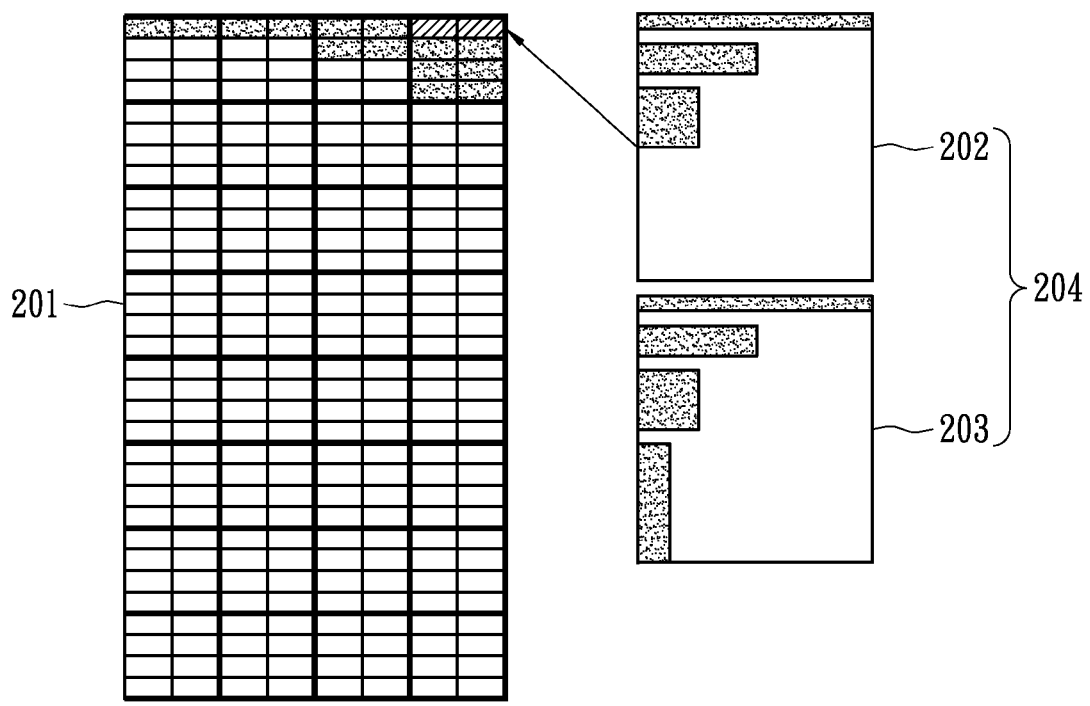
Figure 2C:
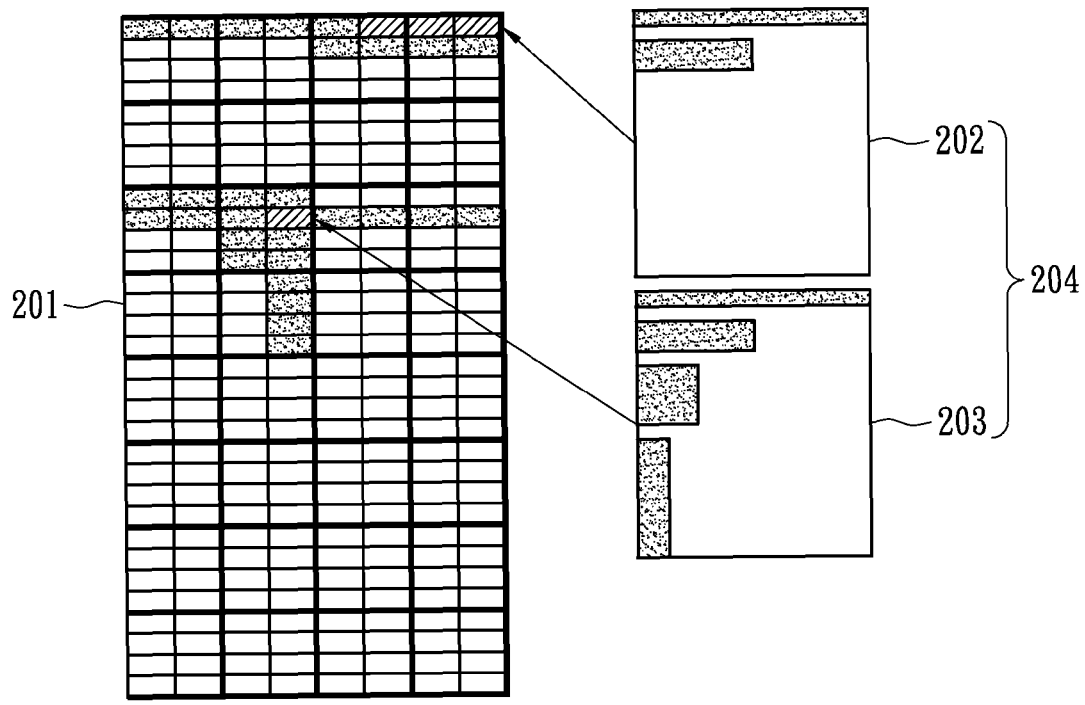
Figure 2D:
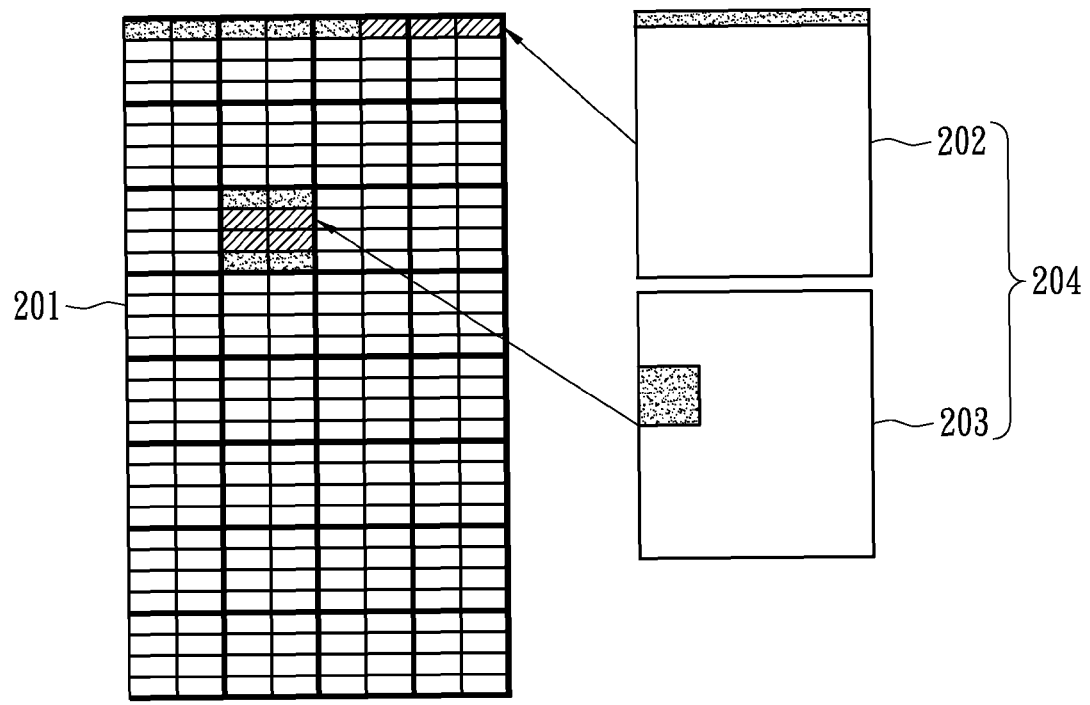

FIGS. 2A-2D show a hint diagram of repairing a memory according to one embodiment of the present invention. As shown in FIG. 2A, the embodiment uses a first spare memory unit and a second spare memory unit to repair a block memory 201. A spare memory redundancy analysis table 204 includes shape flags 202 corresponding to the first spare memory and shape flags 203 corresponding to the second spare memory. When the first defect appears, all the shape flags 202 of the first spare memory corresponding to the address of the defect are extracted to determine if they are qualified for this defective data. As shown in FIG. 2A, there is no unsuitable shape flag corresponding to the address of the defect, thus all the shape flags are marked as valid. As shown in FIG. 2B, when the second defective data appears, a one-row-two-column defective shape is formed with the first defective data, the spare memory redundancy analysis table 204 marks the eight-row-one-column shape flag among the shape flags 202 of the first spare memory unit as invalid. As shown in FIG. 2C, when the third and fourth defective data appear, a one-row-three-column defective shape is formed with the first and second defective data, the spare memory redundancy analysis table 204 marks the four-row-two-column shape flag among the shape flags 202 of the first spare memory unit as invalid. Because the address of the fourth defect cannot be covered by the first spare memory, the second spare memory is used to record the corresponding shape flags in the spare memory redundancy analysis table 204. As shown in FIG. 2D, when the fifth, sixth and seventh defects occur and form a defective shape of two columns and two rows, only two-row-four-column and four-row-two-column defective shapes remaining on the corresponding shape flags 203 of the second spare memory unit are valid. Finally the first and second spare memory units select most favorite defective shapes, which are one-row-eight-column and four-row-two-column defective shapes.

The memory-repairing method in accordance with the present invention is not restricted to build-in self-test (BIST) or built-in self-repair (BISR), and can allocate spare memory units for repairing through an offline software and an external spare memory. Even if the spare memory for repairing is a built-in circuit, it is not restricted to be installed inside the main memory and can be separate from the main memory, and thus capable of being widely applied in electronic products. In addition, only one spare memory for repairing is needed in accordance with this embodiment, thus it effectively saves chip area compared to at least two spare memories used in prior art. Furthermore, the memory-repairing method of the embodiment marks different shape flags to displace column-based or row-based repair method used in prior art, thus it effectively allocates spare memory and reaches a higher utilization.

Figure 3:
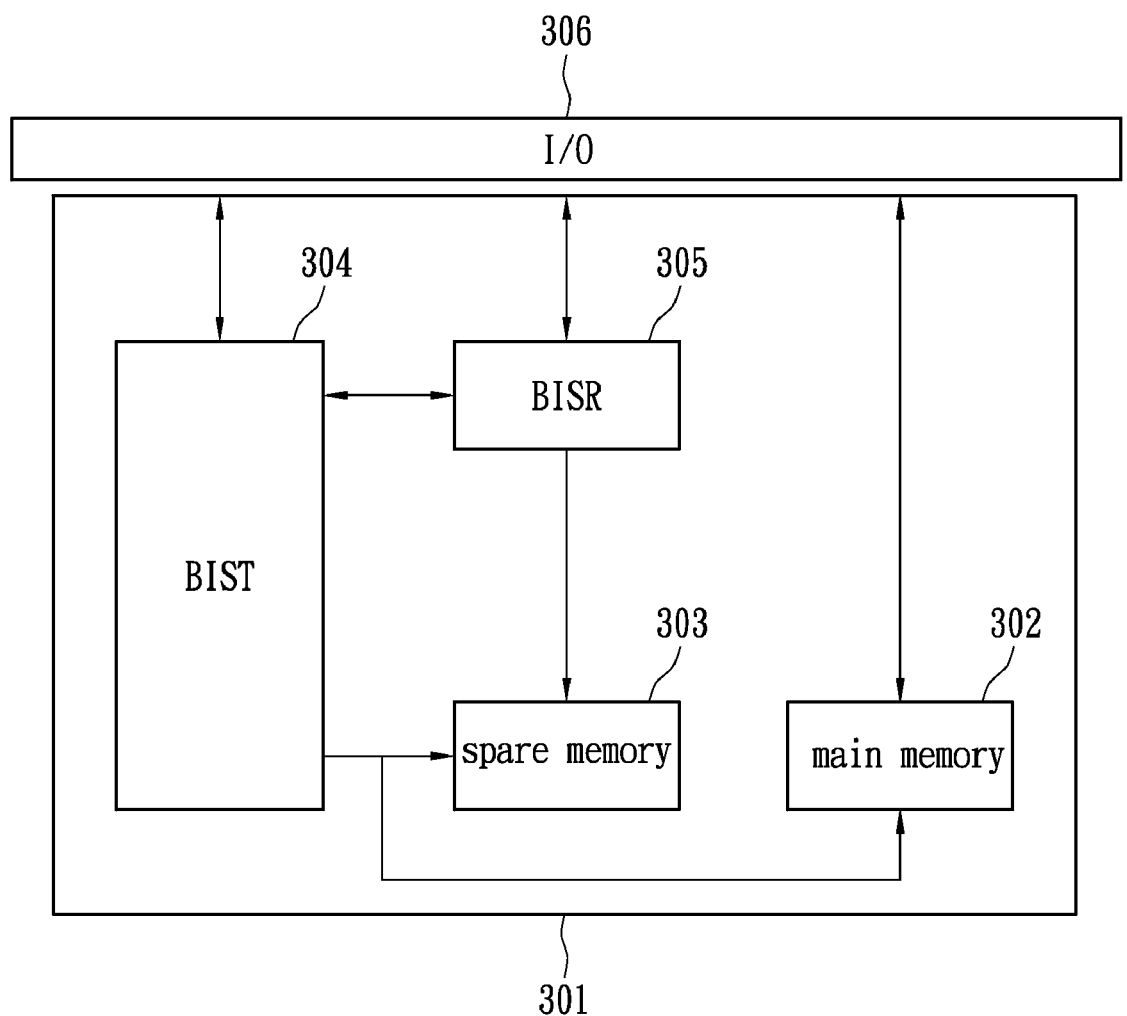
FIG. 3 shows a hint diagram of a memory-repairing system according to one embodiment of the present invention.

FIG. 3 shows a hint diagram of memory-repairing system according to one embodiment of the present invention. The repair system 301 includes a main memory 302, a spare memory 303, a BIST circuit 304 and a BISR circuit 305. The main memory 302 is connected to an I/O circuit 306, while the spare memory 303 is used to provide a plurality of spare memory units to repair the main memory 302. The BIST circuit 304 is connected to the main memory 302, the spare memory 303 and the I/O circuit 306 for testing defective data and address of the main memory 302. The BISR circuit 305 is connected to the spare memory 303 and the I/O circuit 306, allocates the spare memory units of the spare memory 303 to repair the main memory 302 in accordance with the information provided by the BIST circuit 304, and then provides the allocation data to the I/O circuit 306. The BISR circuit 305 further includes a spare memory redundancy analysis table for recording corresponding shape flags of the spare memory and the address of the defective data. On the other hand, the spare memory redundancy analysis table could be provided through an offline software, performing a memory-repairing action by cooperating with the BISR circuit 305.

The above-described embodiments of the present invention are intended to be illustrative only. Numerous alternative embodiments may be devised by person skilled in the art without departing from the scope of the following claims.

What is claimed is:

1. A method for repairing a main memory, comprising the steps of:
   utilizing a spare memory to repair the main memory, wherein the spare memory includes a plurality of spare memory units, wherein each spare memory unit in said plurality of spare memory units has a plurality of permutations, wherein each permutation has a reparable capacity;
   determining a shape of a newly found defect in the main memory, wherein said newly found defect has a defective data address;
   allocating a first spare memory unit;
   determining a first permutation in the first spare memory unit, wherein the first permutation has a reparable capacity sufficient to cover said defective data address;
   wherein said first permutation, a corresponding spare memory address, and a covered defective data address are neither an entire row nor an entire column at a same time; and
   allocating a second spare memory unit to repair the newly found defect if available permutation in the first spare memory unit fail to cover the defective data address of the newly found defect.

2. The method of claim 1, wherein the newly found defect and a previously-found defect constitute an intersection address, and said method further comprising the step of comparing the intersection address with the permutations of the first spare memory unit.

3. The method of claim 2, further comprising the step of selecting a permutation closest to the intersection address.

4. The method of claim 1, wherein the permutations of the first spare memory unit are recorded by marking a plurality of flags.

5. The method of claim 1, further comprising the step of displaying a message of failure to repair if a defect of the main memory exceed a maximal reparable capacity of the spare memory.

6. The method of claim 1, wherein the method is applied to a built-in self-test circuit, wherein the built-in self-test circuit includes a spare memory which is built inside the main memory or separate from the main memory.

7. The method of claim 1, which uses an off-line software and an external spare memory to repair the main memory.

8. A method for repairing a main memory, comprising the steps of:
   utilizing a spare memory to repair the main memory, wherein the spare memory includes a plurality of spare memory units, wherein the main memory has at least one defective permutation, and wherein said spare memory units have a plurality of available permutations;
   comparing the defective permutations of the main memory with available permutations in an allocated spare memory unit;
   excluding available permutation which fail to cover defective permutations of the main memory; and
   utilizing remaining available permutations to repair the main memory;
   wherein the available permutations in the spare memory unit sufficient to cover defective permutations in the main memory, a corresponding spare memory address, and a covered permutations in the main memory are neither an entire row nor an entire column at a same time.

9. The method of claim 8, wherein newly found defects and previously found defects constitute a new permutation, and the method further comprising the step of comparing the new permutation with available permutations of the spare memory unit.

10. The method of claim 8, wherein the available permutations of the spare memory unit are recorded by marking a plurality of flags.

11. The method of claim 8, further comprising the step of displaying a message of failure to repair if a defect of the main memory exceed the maximal reparable capacity of the spare memory unit.

12. The method of claim 8, wherein the method is applied to a built-in self-test circuit, wherein the built-in self-test circuit includes a spare memory which is built inside the main memory or separate from the main memory.

13. The method of claim 8, wherein the method uses an off-line software and an external spare memory to repair the main memory.

14. A system for repairing memory, comprising:

a spare memory configured to provide a plurality of spare memory units;

a built-in self-test circuit connected to the memory and spare memory for testing defects of the memory and corresponding addresses of the defects;

a built-in self-repair circuit connected to the spare memory for allocating spare memory units in accordance with addresses of defects provided by the built-in self-test circuit; and a spare memory redundancy analysis table configured to record available permutations in the spare memory sufficient to cover the defects of the memory;

wherein the available permutations in the spare memory for the defects in the memory, a corresponding spare memory address, and a covered main memory address are neither an entire row nor an entire column at a same time.

15. The system of claim 14, wherein the spare memory redundancy analysis table is allocated in the built-in self-repair circuit.

16. The system of claim 14, wherein the spare memory redundancy analysis table is provided by an off-line software.

17. The system of claim 14, wherein the spare memory redundancy analysis table further records addresses of the defects.

* * * * *